(12) United States Patent
Furusawa

(10) Patent No.: US 11,069,478 B2
(45) Date of Patent: Jul. 20, 2021

(54) LAMINATE OF CERAMIC LAYER AND SINTERED BODY OF COPPER POWDER PASTE

(71) Applicant: JX Nippon Mining & Metals Corporation, Tokyo (JP)

(72) Inventor: Hideki Furusawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 51 days.

(21) Appl. No.: 16/506,611

(22) Filed: Jul. 9, 2019

(65) Prior Publication Data

US 2020/0043654 A1 Feb. 6, 2020

(30) Foreign Application Priority Data

Aug. 1, 2018 (JP) ................................ JP2018145356

(51) Int. Cl.
| | |
|---|---|
| *B22F 7/00* | (2006.01) |
| *H01G 4/008* | (2006.01) |
| *H01G 4/12* | (2006.01) |
| *B22F 7/04* | (2006.01) |

(52) U.S. Cl.
CPC ............. *H01G 4/008* (2013.01); *B22F 7/04* (2013.01); *H01G 4/1227* (2013.01); *H01G 4/1236* (2013.01); *B22F 2301/10* (2013.01); *Y10T 428/12028* (2015.01)

(58) Field of Classification Search
None
See application file for complete search history.

(56) References Cited

U.S. PATENT DOCUMENTS

| | | | | |
|---|---|---|---|---|
| 6,679,937 | B1* | 1/2004 | Kodas | B01J 2/003 |
| | | | | 106/287.19 |
| 2001/0002558 | A1* | 6/2001 | Sano | H01G 4/0085 |
| | | | | 75/373 |
| 2016/0230026 | A1* | 8/2016 | Furusawa | B22F 7/008 |

FOREIGN PATENT DOCUMENTS

| | | |
|---|---|---|
| JP | 2016106175 A | 6/2016 |
| KR | 20010061982 A | 7/2001 |
| KR | 201610230026 A | 3/2016 |
| TW | 201535416 A | 9/2015 |
| WO | 2013118893 A1 | 8/2013 |
| WO | 2013125659 A1 | 8/2013 |
| WO | WO-2013118892 A1 * | 8/2013 ........... H01G 4/2325 |

OTHER PUBLICATIONS

Chinese Office Action in corresponding CN 201910674570.1 dated Jan. 15, 2021, 7 pages.
Korean Office Action in corresponding KR10-2019-0089990 dated Dec. 4, 2020, 6 pages.

* cited by examiner

*Primary Examiner* — Seth Dumbris
(74) *Attorney, Agent, or Firm* — Faegre Drinker Biddle & Reath LLP

(57) ABSTRACT

Provided is a laminate of a sintered body produced by sintering a copper powder paste and a ceramic substrate, which has improved adhesion between the sintered body and the ceramic substrate. A laminate with a copper powder paste sintered body laminated on a non-metal layer, wherein the copper powder paste sintered body has a crystal grain diameter of copper of 10 μm or less, as determined from an EBSD map image, based on Area Fraction method, and has an average reliability index (CI value) of 0.5 or more in an analysis area.

24 Claims, 4 Drawing Sheets
(4 of 4 Drawing Sheet(s) Filed in Color)

LAMINATE OF CERAMIC LAYER AND SINTERED BODY OF COPPER POWDER PASTE

TECHNICAL FIELD

The present invention relates to a laminate of a ceramic layer and a sintered body of a copper powder paste.

BACKGROUND ART

As operating frequency band of electronic devices shifts to a high frequency side, the demand for laminated components having an insulating substrate made of ceramics is increasing. For a capacitor it is MLCC, and for a substrate it is LTCC. The former uses or considers the use of nickel powder for internal electrodes or copper powder for external electrodes as an electrode material, and the latter uses or considers the use of silver powder or copper powder. The copper powder as an electrode material attracts attention, because copper powder is inexpensive as compared with silver powder, as well as more advantageous than nickel in terms of electrical resistance.

The metal powder as the electrode material is mixed with a solvent, a binder resin and the like and processed into a paste, which is printed on a ceramic substrate or a green sheet made of ceramic particles. The resulting laminate is fired in a non-oxidizing atmosphere or reducing atmosphere at 600° C. or higher for example, thereby sintering the metal powders to obtain an electrode. A thermal expansion coefficient of the metal is higher than that of ceramic which is a substrate, and a difference in expansion and contraction is generated during the firing process, so that the fired electrode and the ceramic substrate may be separated. In order to avoid this, ceramic particles forming the ceramic layer or particles called glass frit are added to the metal powder paste, thereby ensuring adhesion between the fired electrode and the ceramic substrate.

The MLCC has limitation of sizes of parts, but if the number of layers can be increased, capacitance per a part can be increased. Therefore, in order to achieve this, it is necessary to apply a thin electrode paste. Further, for the LTCC, a mounting density of the substrate can be increased if a circuit width can be narrowed. Therefore, it is advantageous to be able to print the paste at a fine pitch without disconnection. In order to fulfill such requirements, improvement of a metal powder past and metal powder used for the metal powder paste has been attempted (Patent Document 1, Patent Document 2).

CITATION LIST

Patent Literatures

Patent Document 1: WO 2013/125659 A1
Patent Document 2: WO 2013/118893 A1

SUMMARY OF INVENTION

Technical Problem

As described above, the fired electrode (fired body) has been produced by sintering a paste of metal powder such as copper powder. On the other hand, a composite of the fired body and the ceramic substrate has been increasingly used in a wide temperature range such as on-board application. Therefore, strong adhesion between the fired body and the ceramic substrate is required so that the fired body and the ceramic substrate are not separated even in such a wide temperature range.

Therefore, an object of the present invention is to provide a laminate of a sintered body produced by sintering a copper powder paste and a ceramic substrate, which has improved adhesion between the sintered body and the ceramic substrate.

Solution to Problem

As a result of intensive studies, the present inventors have found that the above object can be achieved by a composite as described below, and completed the present invention.

Thus, the present invention includes the following aspect (1):

(1)

A laminate with a copper powder paste sintered body laminated on a non-metal layer, wherein the copper powder paste sintered body has a crystal grain diameter of copper of 10 μm or less, as determined from an EBSD map image, based on Area Fraction method, and has an average reliability index (CI value) of 0.5 or more in an analysis area.

Advantageous Effects of Invention

According to the present invention, it is possible to obtain a laminate of a sintered body produced by sintering a copper powder paste and a ceramic substrate, which has improved adhesion between the sintered body and the ceramic substrate.

BRIEF DESCRIPTION OF DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENTS

Figure 1:
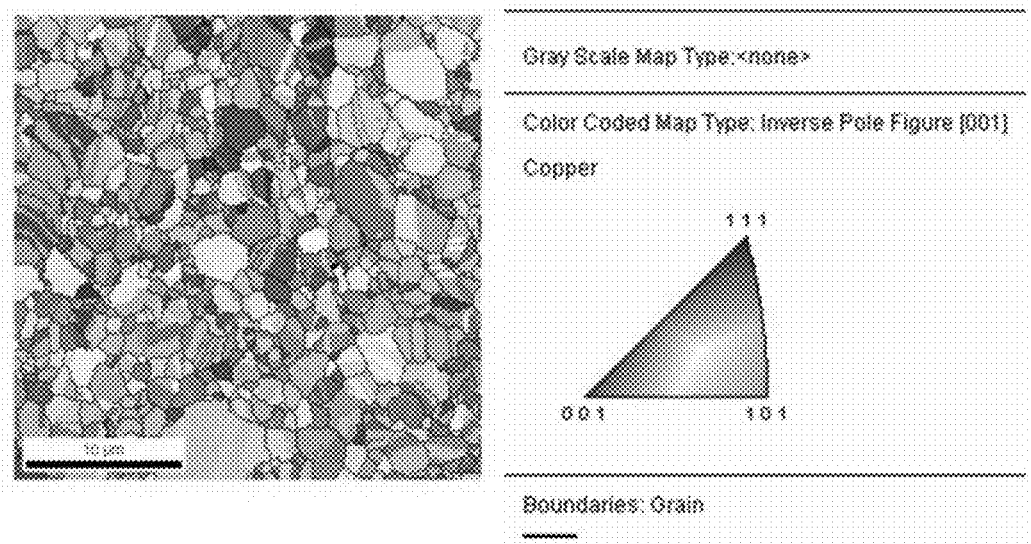
FIG. 1 is an inverse pole figure map (IPF map (Inverse Pole Figure map)) in Inventive Example 1.

Hereinafter, the present invention will be described in detail by way of embodiments. The present invention is not limited to the specific embodiments as described below.

[Laminate in which a Copper Powder Paste Sintered Body is Laminated on a Non-Metal Layer]

A laminate according to the present invention is a laminate in which a copper powder paste sintered body is laminated on a non-metal layer, wherein the copper powder paste sintered body has a crystal grain diameter of copper of 10 μm or less, as determined from an EBSD map image, based on Area Fraction method, and has an average reliability index (CI value) of 0.5 or more in an analysis area.

In a preferred embodiment, the laminate in which the copper powder paste sintered body is laminated on the non-metal layer includes those having such a laminate structure. For example, the laminate includes those in which the copper powder paste sintered body layer is laminated on the non-metal layer, and a non-metal layer is further laminated on the copper powder paste sintered body layer, and also includes laminates formed by repeating these laminations. The term "on a layer" is an expression for explaining a direction of lamination, and is not limited to an upward direction in the vertical direction.

In a preferred embodiment, the non-metal layer can be a ceramic layer. In the present specification, the ceramic layer may be specifically mentioned and described as a preferred non-metal layer.

[Copper Powder Paste Sintered Body]

The laminate according to the present invention can be produced by laminating a copper powder paste sintered body on a non-metal layer, for example a ceramic layer. The copper powder paste sintered body is prepared by sintering the applied copper powder paste.

In a preferred embodiment, the sintering for preparing the copper powder paste sintered body can be carried out by a known means, for example, by maintaining the copper powder paste in a non-oxidizing atmosphere, a weak reducing atmosphere, or a water vapor atmosphere at a temperature of from 500 to 1000° C. for 0.1 to 10 hours.

Prior to the sintering, the copper powder paste is applied to a surface of the non-metal layer such as the ceramic layer. In a preferred embodiment, the application can be carried out by known means, for example by screen printing or dispensing.

[Copper Powder Paste]

The copper powder paste can be prepared by known methods using surface-treated copper powder. In a preferred embodiment, it can be prepared, for example, by kneading the surface-treated copper powder, a solvent, a binder resin, and known additives. In a preferred embodiment, known solvents may be used as the solvent. Examples of such solvents include alcoholic solvents (for example, one or more selected from the group consisting of terpineol, dihydroterpineol, isopropyl alcohol, butyl carbitol, terpinyloxyethanol, and dihydroterpiyloxyethanol), glycol ether solvents (for example, butyl carbitol), acetate solvents (for example, one or more selected from the group consisting of butyl carbitol acetate, dihydroterpineol acetate, dihydrocarbitol acetate, carbitol acetate, linalyl acetate, and terpinyl acetate), ketone solvents (for example methyl ethyl ketone), hydrocarbon solvents (for example, one or more selected from the group consisting of toluene and cyclohexane), cellosolves (for example, one or more selected from the group consisting of ethyl cellosolve, and butyl cellosolve), diethyl phthalate, or propionate solvents (for example, one or more selected from the group consisting of dihydroterpinyl propionate, dihydrocarbyl propionate, and isobornyl propionate). In a preferred embodiment, as the binder resin, a known binder resin can be used. Examples of such a binder resin includes cellulose resins, acrylic resins, alkyd resins, polyvinyl alcohol resins, polyvinyl acetal, ketone resins, urea resins, melamine resins, polyester, polyamide, and polyurethane.

In a preferred embodiment, the copper powder paste that can be used includes a paste to which a glass frit is not added.

[Surface-Treated Copper Powder]

The surface-treated copper powder is used for preparing the copper powder paste. In a preferred embodiment, for example, submicron copper powder can be used as the surface-treated copper powder. For example, copper powder prepared by a wet method can be used. For example, copper powder prepared by a disproportionation method and a chemical reduction method can be used. In a preferred embodiment, the surface treatment for the copper powder can be carried out by mixing with a solution of a copper powder surface treatment agent. For example, the surface treatment can be carried out by applying the copper powder surface treatment agent as disclosed in Patent Document 1 (WO 2013/125659 A1) and Patent Document 2 (WO 2013/118893 A1) according to procedures disclosed in those documents.

In a preferred embodiment, the surface-treated copper powder that can be used includes copper powder having a specific surface area of 1 $m^2g^{-1}$ or more, and preferably 2 $m^2g^{-1}$ or more, for example.

[Non-Metal Layer]

In a preferred embodiment, as the non-metal layer, a layer including at least one of ceramics, Si wafers, and films (for example, resin films) can be used. In a preferred embodiment, the ceramic layer can be used as the non-metal layer.

[Ceramic Layer]

In a preferred embodiment, a ceramic substrate can be used as the ceramic layer. As ceramics of the ceramic substrate, well-known ceramics can be used. Such ceramics include ceramics mainly based on alumina and barium titanate; ceramics which are a sintered body of CuNiZn ferrite particles, and ceramics made of one or more of silicon nitride, aluminum nitride, $CaZrO_3$, $CaTiO_3$, $HfO_2$, $BaTi_2O_5$, and $(K,Na)NbO_3$. Each of these ceramics can be prepared from known materials by known means.

In a preferred embodiment, the ceramics that can be used include a ceramic in which an element having the highest atomic concentration among elements excluding O (oxygen) is Si and an element having the secondly highest atomic concentration is Al.

[Crystal Grain Diameter of Copper Based on Area Fraction Method and CI Value]

In a preferred embodiment, the copper powder paste sintered body of the laminate can have a crystal grain diameter of copper of, for example, 10 μm or less, preferably 5 μm or less, more preferably 3 μm or less, and for example, 0.5 μm or more, preferably 1 μm or more, as determined from an EBSD map image based on the Area Fraction method. More particularly, the crystal grain diameter of copper based on the Area Fraction method can be determined by means as described below in Examples.

Together with the measurement of the crystal grain diameter of copper based on the Area Fraction method, an average reliability index (CI value) indicating to what extent the crystal orientation can be identified in the analysis area is determined. Specifically, the average reliability index (CI value) can be determined by means as described below in Examples. In a preferred embodiment, the average reliability index (CI value) in the analysis area may be, for example, 0.5 or more, and preferably 0.55 or more, for example in a range of from 0.55 to 1.0.

The present inventors have found that when such a state of the copper powder paste sintered body is used as an index, the laminate exhibits improved adhesion of the laminated layers, and results of the tape peeling test is good, and additionally good specific resistance is also achieved, and have completed the present invention. Although its mechanism is not known, the present inventors believe that in such a state where the recrystallized grain is 10 μm or less and CI value is 0.5 or more, the strength of the fired body is high (Hall-Petch's law) and the crystal grains are uniform, so that strain does not tend to be locally accumulated, thereby realizing improved adhesion. The present inventors also believe that since the state where the recrystallized grain is 10 μm or less and CI value is 0.5 or more is formed, it is effective that the surface-treated copper powder in the copper powder paste is sufficiently dispersed in the paste. More specifically, the present inventors believe that when the dispersibility of the copper powder in the paste is poor, that is, aggregates are present in the paste, irregularities can be formed on the measurement surface of EBSD in the fired copper, and the identification ratio of crystal orientation (CI value) will be decreased.

[Ceramic Particles in Copper Powder Paste Sintered Body]

In a preferred embodiment, ceramic particles are present at grain boundaries or in crystal grains of copper in the copper powder paste sintered body. The ceramic particles present may have a particle diameter of, for example, up to 100 nm or less, and preferably up to 50 nm. In a preferred embodiment, ceramic particles having an average particle diameter in a range of from 0.1 nm to 100 nm, preferably in a range of from 1 nm to 50 nm, are present at the grain boundaries or in crystal grains of copper, in the copper powder paste sintered body.

[Specific Resistance]

In a preferred embodiment, the copper powder paste sintered body of the laminate in which the copper powder paste sintered body is laminated on the non-metal layer exhibits good specific resistance. In a preferred embodiment, it can be, for example, in a range of from 1.7 to 10 μΩ·cm, or in a range of from 1.8 to 3.4 μΩ·cm. The specific resistance can be measured by known means.

[Peeling Test]

In a preferred embodiment, the laminate in which the copper powder paste sintered body is laminated on the non-metal layer exhibits good properties in a tape peeling test, that is, exhibits improved adhesion. The tape peeling test can be performed by the procedure of Inventive Example as described below.

PREFERRED EMBODIMENT

In a preferred embodiment, the present invention includes the following aspects, in addition to the aspect (1):

(1)

A laminate with a copper powder paste sintered body laminated on a non-metal layer, wherein the copper powder paste sintered body has a crystal grain diameter of copper of 10 μm or less, as determined from an EBSD map image, based on Area Fraction method, and has an average reliability index (CI value) of 0.5 or more in an analysis area.

(2)

The laminate according to (1), wherein the copper powder paste sintered body comprises ceramic particles that are present at grain boundaries or in crystal grains.

(3)

The laminate according to (2), wherein the ceramic particles have a maximum particle diameter of 100 nm or less.

(4)

The laminate according to any one of (1) to (3), wherein the non-metal layer is a layer comprising at least one of ceramics, Si wafers, and films such as resin films.

(5)

The laminate according to (4), wherein non-metal layer is a ceramic layer.

(6)

The laminate according to any one of (1) to (5), wherein the crystal grain diameter of copper as determined from the EBSD map image based on the Area Fraction method is from 1 μm to 10 μm.

(7)

The laminate according to any one of (1) to (6), wherein the copper powder paste sintered body is a sintered body of a copper powder paste containing no glass frit.

(8)

The laminate according to any one of (1) to (7), wherein the copper powder paste sintered body is a sintered body of a copper powder paste having a specific surface area of 1 $m^2g^{-1}$ or more.

(9)

The laminate according to any one of (1) to (8), wherein the non-metal layer is a layer of alumina, a layer mainly based on barium titanate, a layer of a sintered body of CuNiZn ferrite particles, a layer of aluminum nitride or a layer of silicon nitride.

(10)

The laminate according to any one of (1) to (9), wherein the non-metal layer is a ceramic layer, and wherein in the ceramics of the ceramic layer, an element having a highest atomic concentration among elements other than 0 is Si, and an element having a secondly highest atomic concentration is Al.

(11)

A composite of copper and ceramics, comprising the laminate according to any one of (1) to (10).

(12)

An electronic component comprising the laminate according to any one of (1) to (10).

Thus, the present invention includes the laminate as described above, the composite of copper and ceramics comprising the laminate as described above, the electronic components comprising these, and an electronic device comprising the electronic components.

As described above, the laminate according to the present invention has improved adhesion between the non-metal layer and the copper powder paste sintered body layer. The metal structure of the fired copper of the copper powder paste sintered body has a crystal grain diameter smaller than 10 μm even if it is fired at a high temperature such as 500° C. or more, as described below in Examples. The fired copper having the metal structure also has lower specific resistance, which is expected to be applicable to wiring materials and electrode materials.

In a preferred embodiment, the laminate according to the present invention may be made as part of the electronic component, and may be provided as part of a capacitor such as MLCC, or a substrate such as LTCC, for example. In a preferred embodiment, the laminate according to the present invention includes an embodiment prepared by drilling holes in a ceramic multi-layered substrate for interlayer connection, filling the holes with the copper powder paste and firing it. In a preferred embodiment, the laminate according to the present invention includes an embodiment where the copper powder paste sintered body is used as an electrode. For example, the embodiment is such that the thickness of the electrode is from 0.1 to 1000 μm, and preferably from 0.3 to 100 μm, and even more preferably from 0.5 to 50 μm. In a preferred embodiment, the laminate according to the present invention includes an embodiment where the copper powder paste sintered body is used as a wiring of a circuit. For example, the embodiment is such that a wiring pitch (circuit width) is from 1 to 5000 μm, and preferably from 5 to 3000 μm.

Examples

The present invention will be described in more detail by way of the following examples. The present invention is not limited to the following examples.

Example 1: Preparation of Submicron Copper Powder 2.5 L of 25 vol % diluted sulfuric acid was instantaneously added to a slurry consisting of 1 kg of cuprous oxide, 4 g of gum arabic and 7 L of pure water, and stirred at 500 rpm for 10 minutes. After the copper powder obtained in the operation was sufficiently precipitated, the resulting supernatant was removed, 7 L of pure water was added, and the mixture was stirred at 500 rpm for 10 minutes. This operation was repeated until a Cu concentration derived from $Cu^{2+}$ in the supernatant was less than 1 g/L.

Example 2: Inventive Examples 1 to 3

(Surface Treatment of Copper Powder)

5, 40 and 60 mL of diaminosilane (A-1120 (available from MOMENTIVE)) were collected, mixed with pure water so as to have 500 mL in total, and stirred overnight at about 200 rpm. Each supernatant of the precipitated slurry prepared in Example 1 was removed, and the precipitated copper powder and an aqueous diaminosilane solution were stirred at 500 rpm for 1 hour. After stirring, solid-liquid separation was performed using a table-top centrifugal separator under conditions of 1500 rpm for 30 minutes to obtain a solid (a water content of from 10 to 13%). The solid is dried in a nitrogen atmosphere at 100° C. for 2 hours, and then crushed with a pestle and mortar until the total amount of the solid passed through a 1 mm sieve, and then ground with a bench jet mill under a grinding pressure of 0.4 MPa. A BET specific surface area of the powder obtained by grinding was measured by a fluid method using Macsorb HM model-1201 (one-point method of the fluid method; degassing conditions: 150° C., 20 minutes, atmospheric pressure, nitrogen flow). It was from 3.1 to 3.2 $m^2g^{-1}$.

(Preparation of Paste)

A vehicle previously prepared by kneading terpineol and ethylcellulose in a rotation revolution mixer was mixed with oleic acid and copper powder such that a ratio of the vehicle, oleic acid and copper powder was copper powder:ethyl cellulose:oleic acid:terpineol=80:2.3:1.6:16.1 (weight ratio), pre-kneaded with a rotation revolution mixer, and then passed through three rolls (a finish roll gap of 5 μm), and defoamed using the rotation revolution mixer. The resulting paste was coated onto a slide glass using a 25 μm gap applicator and dried at 120° C. for 10 minutes. Rz of the resulting coated film in the coating direction was measured with a contact needle type roughness meter, confirming that an average at five points was 2 μm or less. That is, it was confirmed that the size of aggregates contained in the paste was 2 μm or less.

(Production of Laminate of Sintered Body and Ceramics)

Three lines having a width of 5 mm and a length of 20 mm were printed on an alumina substrate (purity 99.5%) having a surface roughness Ra of 0.04 μm using a screen printing plate (stainless mesh; a wire diameter of 18 μm; a gauze thickness of 38 μm; opening of 33 μm; an opening ratio of 42%). This was fed at a rate of 0.75° C./min up to 850° C. and maintained at 850° C. for 20 minutes while bubbling pure water with nitrogen at 25° C. and feeding the nitrogen-containing water vapor at a rate of 2 L/min. Thus, the fired body of the paste was formed on the ceramic substrate to obtain a laminate of a fired body and ceramics.

(Measurement of Resistance and Peeling Test)

A surface resistance and a thickness of a circuit having a width of 5 mm and a length of 20 mm obtained by cooling to room temperature was measured, and a specific resistance was determined by averaging three points. Further, using a carbon double-sided tape (available from Nisshin EM Co., Ltd.) for the circuit and the substrate, a peeling test was conducted according to JIS Z 0237 to confirm whether or not the circuit adhered to the adhesive surface of the tape.

(EBSD Map, Area Fraction Method, CI Value)

Further, a fired circuit surface on the resulting alumina substrate was subjected to flat milling with Ar ions (an accelerating voltage of 15 kV) for 3 minutes, and an EBSD map was then photographed, and a crystal grain diameter was determined by the Area Fraction method. At the same time, a reliability index (expressed as an average CI value in the table) was determined, which indicates, to what extent, the crystal orientation could be identified in the analysis area.

Device: SEM (SU-70 (from Hitachi High-Technologies Corporation));

Analysis target: 30 μm×30 μm;

Data acquisition interval: 0.2 μm;

Analysis software: TSL OIM Data Collection ver. 5.31

(Twin crystals were not counted as crystal grains).

(STEM Observation and EDS Analysis)

The laminate of Inventive Example 3 was subjected to FIB processing from the surface of the sintered body, the laminate of the sintered body and the substrate was removed as a thin film, and the metal structure was observed by STEM. Although a metallographic structure within 1 μm from the boundary was actually observed due to the operability of FIB processing, it was confirmed that the metallographic structure was uniform in the thickness direction of the sintered body during FIB processing. Component analysis of a foreign matter present at the grain boundaries of the metal structure of the sintered body by EDS revealed that the foreign matter was $SiO_2$ having a size of about 20 nm.

Device: STEM;

Cross-sectional TEM image magnification: from 10 to 500,000 times (*observation magnification was adjusted as needed);

Characteristic X-ray: Beam diameter of irradiated electrons: 1 nm;

Scanning distance: 60 nm.

FIG. 1 is an inverse pole figure map (IPF map (Inverse Pole Figure map)) in Inventive Example 1.

Figure 2:
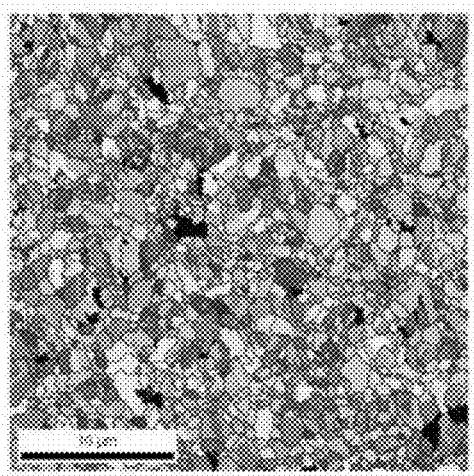
FIG. 2 is an inverse pole figure map (IPF map (Inverse Pole Figure map)) in Inventive Example 3.
Figure 2:
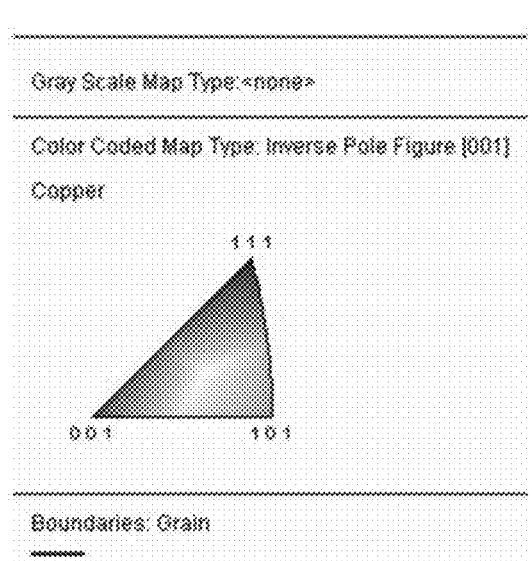

FIG. 2 is an inverse pole figure map (IPF map (Inverse Pole Figure map)) in Inventive Example 3.

Figure 3A:
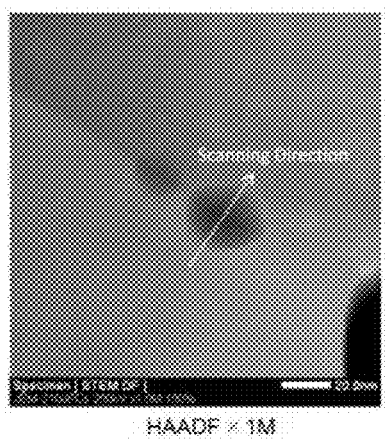
FIGS. 3A and 3B show results of STEM observation and EDS analysis near grain boundaries in Inventive Example 3.
Figure 3B:
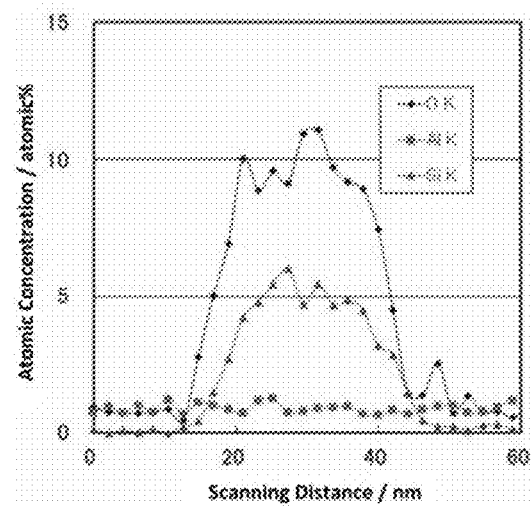

FIGS. 3A and 3B show results of STEM observation and EDS analysis near grain boundaries in Inventive Example 3.

Example 3: Inventive Example 4

The same operation as that of Inventive Example 3 of Example 2 was carried out, with the exception that the composition of the paste was copper powder:ethylcellulose: terpineol=80:2.3:17.7 (weight ratio).

Example 4: Inventive Example 5

The same operation as that of Example 2 was carried out with the exception that in the step of the surface treatment, 20 mL of diaminosilane (A-1120 (available from MOMEN- TIVE)), 10 mL of epoxysilane (Z-6040 (available from Dow Toray Co., Ltd.)) and 470 mL of pure water were used.

Example 5: Inventive Example 6

The same operation as that of Example 4 was carried out with the exception that in the step of the surface treatment, epoxysilane was changed to tetraethoxysilane (available from Tokyo Chemical Industry Co., Ltd.).

Example 6: Inventive Example 7

The same operation as that of Inventive Example 3 of Example 2 was carried out with the exception that in the step of the surface treatment, diaminosilane was changed to a titanate coupling agent (PLENACT 44 (available from Ajinomoto Fine-Techno Co., Ltd.)).

Example 7: Inventive Example 8

The same operation as that of Example 4 was carried out with the exception that in the step of the surface treatment, 30 mL of diaminosilane (A-1120 (available from MOMENTIVE)), 20 mL of a titanate coupling agent (PLENACT 44 available from Ajinomoto Fine-Techno Co., Ltd.), and 450 mL of pure water were used.

Example 8: Inventive Example 9

The same operation as that of Example 4 was carried out with the exception that in the step of the surface treatment, 30 mL of a titanate coupling agent (PLENACT 44 (available from Ajinomoto Fine-Techno Co., Ltd.)), 40 mL of an organic zirconium compound (ORGATIX ZC-300 (available from Matsumoto Fine Chemical Co., Ltd.)), and 430 mL of pure water were used.

Example 9: Inventive Example 10

The same operations as that of Example 4 were carried out with the exception that in the step of the surface treatment, 30 mL of diaminosilane (A-1120 (available from MOMENTIVE)), 40 mL of an organic zirconium compound (ORGATIX ZC-300 (available from Matsumoto Fine Chemical Co., Ltd.)) and 430 mL of pure water were used.

Example 10: Inventive Examples 11 to 13

The same operations as that of Example 2 were carried out with the exception that the pastes of Examples 1 to 3 were used and the firing atmosphere was changed to $N_2$.

Example 11: Inventive Example 14

The same operation as that of Example 2 was carried out with the exception that the paste of Example 2 was used and the firing atmosphere was changed to $N_2$ containing 2% of $H_2$.

Example 12: Inventive Examples 15 to 17

(Preparation of Ceramic Substrate)
BaTiO$_3$ particles (available from Nisshin Engineering Co., Ltd.; a particle diameter of 50 nm), terpineol and ethylcellulose were mixed such that a ratio of them was BaTiO$_3$ particles:ethyl cellulose:terpineol=50:10:40 (weight ratio), pre-kneaded with a rotation revolution mixer, and then passed through three rolls (a finish roll gap of 5 μm) and defoamed using the rotation revolution mixer. The resulting paste was coated onto a PET film using a 25 μm gap applicator and dried at 120° C. for 10 minutes. The PET film was removed from the dried coating, and the dried coating was fired at 1200° C. in an air atmosphere.
(Production of Laminate of Sintered Body and Ceramics)
The same operation as that of Example 2 was carried out with the exception that the paste of Example 3 was printed on the resulting substrate, and the firing atmosphere was changed to $N_2$, water vapor, or $N_2$ containing 2% $H_2$.

Example 13: Inventive Example 18

The paste of Inventive Example 7 was printed on the BaTiO$_3$ sheet (fired at 1200° C.) prepared in Example 12, and the same operation as that of Example 12 (Inventive Example 17) was carried out.

Example 14: Inventive Examples 19 to 21

The same operation as that of Example 2 was carried out with the exception that the substrate was printed on a silicon nitride substrate (available from Toshiba Material Co., Ltd.) using the paste of Inventive Example 3 and the firing atmosphere was $N_2$, water vapor or $N_2$ containing 2% $H_2$.

Example 15: Inventive Example 22

(Preparation of Ceramic Substrate, Preparation and Evaluation of Laminate of Sintered Body and Ceramics)
Alumina particles and silica particles were crushed at a weight ratio of 1:1 using zirconia beads, mixed such that a ratio of ethyl cellulose and terpineol was (alumina+zirconia):ethyl cellulose:terpineol=50:10:40 (weight ratio), and then pre-kneading with a rotation revolution mixer, and passed through three rolls (a finish roll gap of 5 μm) and defoamed using the rotation revolution mixer. The resulting paste was coated onto a PET film using a 25 μm gap applicator and dried at 120° C. for 10 minutes. The Ra of the dried coating was 0.25 μm. The PET film was removed from the dried coating and the paste of Inventive Example 3 was printed.
The temperature was increased to 700° C. at a rate of 0.75° C./min and maintained at 700° C. for 20 minutes while feeding nitrogen at a rate of 2 L/min, with which pure water was bubbled at 25° C.
The same operation as that of Example 2 was carried out and the resulting laminate was evaluated.

Example 16: Inventive Example 23

The paste of Inventive Example 3 was printed on the alumina/silica green sheet prepared in Example 15, and the temperature was increased to 500° C. at a rate of 0.75° C./min and maintained at 500° C. for 20 minutes while feeding the atmosphere from a compressor at a rate of 2 L/min. Subsequently, the temperature was increased to 850° C. at a rate of 0.75° C./min and maintained at 850° C. for 20 minutes while feeding $N_2$ containing 2% $H_2$ at a rate of 2 L/min. The same operation as that of Example 2 was carried out, unless otherwise stated.

Example 17: Inventive Example 24

(Preparation of Ceramic Substrate, Preparation and Evaluation of Laminate of Sintered Body and Ceramics) Ferrite particles (an average particle diameter of 0.1 μm) of NiCuZn with $Fe_2O_3$:NiO:CuO:ZnO=49.5:10.0:10.0:30.5 (molar ratio), ethylcellulose and terpineol were mixed such that a ratio of them was NiCuZn particle:ethyl cellulose:terpineol=50:10:40 (weight ratio), pre-kneading with a rotation revolution mixer, and then passed through three rolls (a finish roll gap of 5 μm) and defoamed using the rotation revolution mixer. The resulting paste was coated onto a PET film using a 25 μm gap applicator and dried at 120° C. for 10 minutes. The Ra of the dried coating was 0.25 μm. The PET film was removed from the dried coating and the paste of Example 3 was printed.

The temperature was increased to 700° C. at a rate of 0.75° C./min and maintained at 700° C. for 20 minutes while feeding nitrogen at a rate of 2 L/min, with which pure water was bubbled at 25° C.

The same operation as that of Example 2 was carried out and the resulting laminate was evaluated.

Example 18: Inventive Example 25

The paste of Inventive Example 3 was printed on the NiZnCu green sheet prepared in Example 17, and the temperature was increased to 500° C. at a rate of 0.75° C./min and maintained at 500° C. for 20 minutes while feeding the atmosphere from a compressor at a rate of 2 L/min. Subsequently, the temperature was increased to 850° C. at a rate of 0.75° C./min and maintained at 850° C. for 20 minutes while feeding $N_2$ containing 2% $H_2$ at a rate of 2 L/min. The same operation as that of Example 2 was carried out and the resulting laminate was evaluated.

Example 19: Comparative Examples 1 to 5

The copper powder prepared in Example 1 is centrifuged and dried without treatment with a coupling agent, and the resulting copper powder was processed into a paste according to the procedure of Example 2, and the same operations as those of Examples 11, 12 (Inventive Example 17), 14 (Inventive Example 21), 16 and 18 were carried out, and the resulting laminate was evaluated. In Comparative Examples 1 to 5, the paste containing the copper powder which had not been subjected to the predetermined surface treatment was used, so that the crystal grains tended to grow due to the absence of ceramic particles at the grain boundaries or in the crystal grains. Therefore, in Comparative Examples 1 to 5, the crystal grain diameter is more likely to vary and strain is more likely to be locally accumulated than in Examples. As a result, the adhesion between copper and ceramics would be insufficient in Comparative Examples 1 to 5.

Example 20: Comparative Examples 6 to 8

5 mL of diaminosilane (A-1120 (available from MOMENTIVE)) was collected, mixed with pure water so as to have 500 mL in total, and stirred overnight at about 200 rpm. The resulting supernatant of the precipitated slurry prepared in Example 1 was removed, and the precipitated copper powder and an aqueous diaminosilane solution were stirred at 500 rpm for 5 hours. Surface-treated copper powder was then obtained by the procedure of Example 2. The copper powder was mixed such that a ratio of copper powder:ethylcellulose:oleicacid:terpineol=80:2.3:1.6:16.1 (weight ratio), and kneaded by a rotation revolution mixer to prepare pastes. Using the pastes, laminates were prepared by the procedure of Example 2 and evaluated. For these pastes, a large number of particles at a visually observable level were observed in the coating after screen printing of Example 2. This would be because the dispersibility was decreased and aggregates were generated due to the differences in the time treated with the coupling agent, the paste preparation conditions, and the like from those of Example 2.

Figure 4:
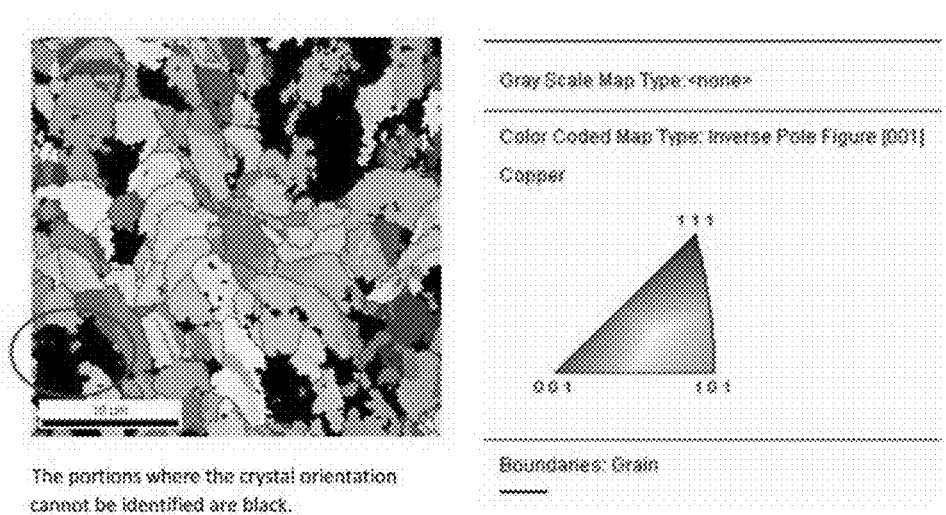
FIG. 4 is an inverse pole figure map (IPF map (Inverse Pole Figure map)) in Comparative Example 1.

FIG. 4 is an inverse pole figure map (IPF map (Inverse Pole Figure map)) in Comparative Example 1.

(Results)

The results of Inventive Examples and Comparative Examples are summarized in Table 1 below. Comparative Examples had the lower average CI value (the ratio at which the crystal orientation of fired copper can be identified). For example, the black parts in the EBSD map image in FIG. 4 are those where the crystal orientation could not be identified. In the present comparative examples where the ratio at which the crystal orientation cannot be identified is higher, that is, the entire CI value is lower, peeling easily occurred from various ceramic substrates. Moreover, each specific resistance of each sintered body of those comparative examples is higher. On the other hand, in Inventive Examples, the ratio at which the crystal orientation can be identified is higher (FIG. 1, FIG. 2), and firm adhesion to various ceramics is observed. The specific resistance is also lower, probably because of the higher ratio of crystals that can be identified. The metal structure of Inventive Example 3 was observed by STEM and EDS, confirming that ceramic particles presumed to be derived from the copper powder surface treatment agent were precipitated at grain boundaries. Even though the firing is carried out at a high temperature of 500° C. or more, the resulting fired copper has the small grain diameter. This would be because the ceramic particles having about several tens of nm are present at the grain boundaries or in crystal grains of fired copper. The laminate of the copper powder paste fired body and the ceramic layer, which has the metal structure according to the present invention, has high adhesion and low specific resistance, which is expected to be suitable for LTCC wiring materials, MLCC internal electrodes and external electrodes.

TABLE 1

| | Adhesion Amount of Copper Powder Surface Treatment | | | | Firing Atmosphere | | | | Boundary Particle Diameter by Area | | | |
|---|---|---|---|---|---|---|---|---|---|---|---|---|
| | Element/ppm | | | | | | Atmosphere/ | Average | Fraction | Specific | Tape |
| | Si | Ti | Zr | Substrate | $N_2$ | $H_2O/N_2$ | 2% $H_2$ | CI Value | Method/μm | Resistance/μΩ cm | Peeling |
| Inventive Example 1 | 360 | — | — | Alumina | ○ | | | 0.74 | 2.1 | 1.8 | None |
| Inventive Example 2 | 1000 | — | — | | ○ | | | 0.60 | 1.3 | 2.0 | None |

TABLE 1-continued

| | Adhesion Amount of Copper Powder Surface Treatment Element/ppm | | | | Firing Atmosphere | | | | Boundary Particle Diameter by Area | | Specific Resistance/μΩ cm | Tape Peeling |
|---|---|---|---|---|---|---|---|---|---|---|---|---|
| | Si | Ti | Zr | Substrate | N$_2$ | H$_2$O/N$_2$ | Atmosphere/ 2% H$_2$ | Average CI Value | Fraction Method/μm | | | |
| Inventive Example 3 | 1500 | — | — | | ○ | | | 0.59 | 1.2 | | 2.2 | None |
| Inventive Example 4 | 1500 | — | — | | ○ | | | 0.58 | 1.2 | | 2.2 | None |
| inventive Example 5 | 2300 | — | — | | ○ | | | 0.56 | 1.1 | | 2.4 | None |
| Inventive Example 6 | 2100 | | | | ○ | | | 0.57 | 1.1 | | 2.5 | None |
| Inventive Example 7 | — | 980 | — | | ○ | | | 0.63 | 1.5 | | 2.1 | None |
| Inventive Example 8 | 980 | 450 | — | | ○ | | | 0.57 | 1.4 | | 2.2 | None |
| Inventive Example 9 | — | 650 | 550 | | ○ | | | 0.63 | 1.6 | | 2.1 | None |
| inventive Example 10 | 950 | — | 430 | | ○ | | | 0.60 | 1.4 | | 2.2 | None |
| Inventive Example 11 | 360 | — | — | | | ○ | | 0.66 | 6.8 | | 2.9 | None |
| Inventive Example 12 | 1000 | — | — | | | ○ | | 0.60 | 2.0 | | 2.4 | None |
| Inventive Example 13 | 1500 | — | — | | | ○ | | 0.56 | 1.6 | | 2.3 | None |
| inventive Example 14 | 1000 | — | — | | | | ○ | 0.62 | 1.4 | | 2.5 | None |
| Inventive Example 15 | 1500 | — | — | BaTiO$_3$ | ○ | | | 0.56 | 1.6 | | 2.5 | None |
| Inventive Example 16 | 1500 | — | — | | | ○ | | 0.58 | 1.3 | | 2.3 | None |
| Inventive Example 17 | 1500 | — | — | | | | ○ | 0.59 | 1.4 | | 2.6 | None |
| inventive Example 18 | — | 980 | — | | | | ○ | 0.60 | 1.5 | | 2.5 | None |
| inventive Example 19 | 1500 | — | — | SiN | ○ | | | 0.60 | 1.2 | | 3.4 | None |
| Inventive Example 20 | 1500 | — | — | | | ○ | | 0.62 | 1.4 | | 2.9 | None |
| Inventive Example 21 | 1500 | — | — | | | | ○ | 0.62 | 1.3 | | 3.0 | None |
| Inventive Example 22 | 1500 | — | — | Al$_2$O$_3$ + SiO$_2$ | | ○ | | 0.61 | 1.3 | | 2.4 | None |
| Inventive Example 23 | 1500 | — | — | Green Sheet | | | ○ | 0.60 | 1.4 | | 2.3 | None |
| Inventive Example 24 | 1500 | — | — | NiZnCu | | ○ | | 0.57 | 1.4 | | 2.4 | None |
| Inventive Example 25 | 1500 | — | — | Green Sheet | | | ○ | 0.59 | 1.3 | | 2.3 | None |
| Comparative Example 1 | — | — | — | Alumina | | | ○ | 0.33 | 3.7 | | 3.5 | Yes |
| Comparative Example 2 | — | — | — | BaTiO$_3$ | | | ○ | 0.31 | 4.6 | | 6.5 | Yes |
| Comparative Example 3 | — | — | — | SiN | | | ○ | 0.29 | 5.2 | | 8.1 | Yes |
| Comparative Example 4 | — | — | — | Al$_2$O$_3$ + SiO$_2$ | | | ○ | 0.31 | 4.1 | | 5.2 | Yes |
| Comparative Example 5 | — | — | — | NiZnCu | | | ○ | 0.35 | 4.7 | | 5.9 | Yes |
| Comparative Example 6 | 880 | — | — | Alumina | ○ | | | 0.45 | 6.2 | | 3.2 | Yes |
| Comparative Example 7 | 880 | — | — | | | ○ | | 0.41 | 6.5 | | 2.8 | Yes |
| Comparative Example 8 | 880 | — | — | | | | ○ | 0.43 | 5.6 | | 3.4 | Yes |

INDUSTRIAL APPLICABILITY

The present invention provides a laminate in which a copper powder paste sintered body is laminated on a ceramic substrate, which has improved adhesion between the ceramic layer and the copper powder paste sintered body. The present invention is an industrially useful invention.

What is claimed is:

1. A laminate with a copper powder paste sintered body laminated on a non-metal layer, wherein the copper powder paste sintered body has a crystal grain diameter of copper of 10 μm or less, as determined from an EBSD map image, based on an Area Fraction method, and has an average reliability index (CI value) of 0.5 or more in an analysis area.

2. The laminate according to claim 1, wherein the copper powder paste sintered body comprises ceramic particles that are present at grain boundaries or in crystal grains.

3. The laminate according to claim 2, wherein the ceramic particles have a maximum particle diameter of 100 nm or less.

4. The laminate according to claim 1, wherein the non-metal layer is a layer comprising at least one of ceramics, Si wafers, and resin films.

5. The laminate according to claim 4, wherein non-metal layer is a ceramic layer.

6. The laminate according to claim 1, wherein the crystal grain diameter of copper as determined from the EBSD map image based on the Area Fraction method is from 1 μm to 10 μm.

7. The laminate according to claim 1, wherein the copper powder paste sintered body is a sintered body of a copper powder paste containing no glass frit.

8. The laminate according to claim 1, wherein the copper powder paste sintered body is a sintered body of a copper powder paste having a specific surface area of 1 m2g-1 or more.

9. The laminate according to claim 1, wherein the non-metal layer is a layer of alumina, a layer mainly based on barium titanate, a layer of a sintered body of CuNiZn ferrite particles, a layer of aluminum nitride or a layer of silicon nitride.

10. The laminate according to claim 1, wherein the non-metal layer is a ceramic layer, and wherein in the ceramics of the ceramic layer, an element having a highest atomic concentration among elements other than O is Si, and an element having a secondly highest atomic concentration is Al.

11. A composite of copper and ceramics, comprising the laminate according to claim 1.

12. A composite of copper and ceramics, comprising the laminate according to claim 6.

13. A composite of copper and ceramics, comprising the laminate according to claim 7.

14. A composite of copper and ceramics, comprising the laminate according to claim 8.

15. An electronic component comprising the laminate according to claim 1.

16. An electronic component comprising the laminate according to claim 2.

17. An electronic component comprising the laminate according to claim 3.

18. An electronic component comprising the laminate according to claim 4.

19. An electronic component comprising the laminate according to claim 5.

20. An electronic component comprising the laminate according to claim 6.

21. An electronic component comprising the laminate according to claim 7.

22. An electronic component comprising the laminate according to claim 8.

23. An electronic component comprising the laminate according to claim 9.

24. An electronic component comprising the laminate according to claim 10.

\* \* \* \* \*